United States Patent [19]

Matsuo et al.

[11] Patent Number: 5,544,098

[45] Date of Patent: *Aug. 6, 1996

[54] SEMICONDUCTOR MEMORY DEVICE HAVING AN AUTOMATICALLY ACTIVATED VERIFY FUNCTION CAPABILITY

[75] Inventors: Akinori Matsuo, Higashiyamato; Masashi Watanabe, Kokubunji; Masashi Wada; Takeshi Wada, both of Akishima; Yasuhiro Nakamura, Kodaira, all of Japan

[73] Assignees: Hitachi, Ltd.; Hitachi ULSI Engineering Corp., both of Tokyo, Japan

[*] Notice: The term of this patent shall not extend beyond the expiration date of Pat. No. 5,434,819.

[21] Appl. No.: 455,152

[22] Filed: May 31, 1995

Related U.S. Application Data

[63] Continuation of Ser. No. 282,313, Jul. 29, 1994, Pat. No. 5,434,819, which is a continuation of Ser. No. 34,644, Mar. 22, 1993, abandoned, which is a continuation of Ser. No. 741,224, Aug. 5, 1991, abandoned, which is a continuation of Ser. No. 440,338, Nov. 22, 1989, abandoned.

[30] Foreign Application Priority Data

Nov. 22, 1988 [JP] Japan .................................. 63-295172

[51] Int. Cl.$^6$ ........................................ G11C 7/00
[52] U.S. Cl. ................ 365/189.07; 365/189.05; 365/230.08; 371/21.2
[58] Field of Search ................ 365/189.07, 189.05, 365/230.08; 371/21.2

[56] References Cited

U.S. PATENT DOCUMENTS

| 4,460,982 | 7/1984 | Gee et al. ............................. 365/189.07 |
| 4,701,886 | 10/1987 | Sakakibara et al. ................. 365/189.07 |
| 4,788,665 | 11/1988 | Fukuda et al. ........................... 365/189 |
| 4,811,294 | 3/1989 | Kobayashi et al. ..................... 371/21.2 |
| 5,053,990 | 10/1991 | Kreifels et al. ........................... 395/425 |
| 5,434,819 | 7/1995 | Matsuo et al. ...................... 365/189.07 |

FOREIGN PATENT DOCUMENTS

| 55-8696 | 1/1980 | Japan . |
| 58-169395 | 10/1983 | Japan . |
| 62-8397 | 1/1987 | Japan . |
| 62-52798 | 3/1987 | Japan . |
| 62-164299 | 7/1987 | Japan . |
| 62-188100 | 8/1987 | Japan . |
| 62-205599 | 9/1987 | Japan . |
| 62-236199 | 10/1987 | Japan . |
| 62-298096 | 12/1987 | Japan . |

OTHER PUBLICATIONS

Hitachi publication "Hitachi IC Memory Data Book", pp. 489–603, (Jun. 1987).

Primary Examiner—David C. Nelms
Assistant Examiner—Son Dinh
Attorney, Agent, or Firm—Antonelli, Terry, Stout & Kraus

[57] ABSTRACT

A semiconductor memory device having a plurality of nonvolatile memory devices or elements disposed in a matrix arrangement as one or more memory arrays is provided with a write operation and a verify mode which is automatically implemented when the write operation of the memory device ends. In connection with this, an auto-verify function is set in an internal circuit associated with the memory in accordance with a predetermined control signal and wherein a read mode subsequent to the write operation is implemented. During the auto-verify function, the read mode is implemented by effecting a data comparison circuit, such as an exclusive-OR logic circuit, which performs a coincidence/non-coincidence operation comparing the write data and the read data.

81 Claims, 8 Drawing Sheets

SEMICONDUCTOR MEMORY DEVICE HAVING AN AUTOMATICALLY ACTIVATED VERIFY FUNCTION CAPABILITY

CROSS-REFERENCE TO RELATED APPLICATION

This is a divisional of application Ser. No. 08/282,313 filed Jul. 29, 1994 now U.S. Pat. No. 5,434,819; which is a continuation of application Ser. No. 08/034,644 filed Mar. 22, 1993, now abandoned; which is a continuation of application Ser. No. 07/741,224 filed Aug. 5, 1991, now abandoned; and which, in turn, is a continuation of application Ser. No. 07/440,338 filed Nov. 22, 1989, now abandoned.

A related U.S. application Ser. No. 07/440,323, now U.S. Pat. No. 5,134,583, entitled "Nonvolatile Semiconductor Memory Device Having Redundant Data Lines Controllably Addressed in Response to a Defective Address," commonly assigned, has been filed on even date herewith.

BACKGROUND OF THE PRESENT INVENTION

1. Field of the Invention

This invention relates to a semiconductor memory device and to a technique which will be effective when utilized for a nonvolatile semiconductor memory device, such as an EPROM (Erasable & Programmable Read-Only Memory), which is capable of writing data electrically.

2. Description of the Related Subject Matter

The data write operation in an EPROM comprises designating an address, inputting information data to be written, setting the operation mode thereof to a write mode by an externally applied control signal and writing information data into a selected memory cell. When the write operation is completed, the operation mode is then set to a verify (read) mode by an externally applied control signal. That is, the memory cell at the address described above into which the write operation is made is read out and a write confirmation is made by a writing device (EPROM writer) between the information data to be written and the information data that is read out. Such an EPROM is described, for example, in the publication, "Hitachi IC Memory Data Book," June 1987, pps. 489–603.

In conventional EPROMs the operation mode is designated by externally applied control signals, as described above. Therefore, if the write operation is attempted from a microprocessor or the like under the state where the EPROM is assembled in a microcomputer system (on-board state), the microprocessor itself must continue to generate the external control signal described above, for the write mode time period, although it needs a relatively long period. The inventors of the present invention have determined that in the interim, the operations of the microprocessor and the like are not fully or satisfactorily carried out resulting in the through-put of the system becoming extremely deteriorated.

SUMMARY OF THE PRESENT INVENTION

It is an object of the present invention to provide a semiconductor memory device which automates the setting of a verify mode (automatically sets the verify mode) after the write operation is completed.

Among the various aspects disclosed which typify the present application, the following is a brief description of an embodiment thereof. Namely, a write time for a memory array consisting of nonvolatile memory devices involves changing the threshold voltages of accessed devices (memory elements or memory cells) in accordance with electrical write information data and which nonvolatile memory devices are disposed in a matrix arrangement including rows and columns of such devices. The write time is set in accordance with a time signal generated by an internal circuit, and the operation mode of the memory array thereof is automatically switched to a verify mode after the write operation is completed.

According to the means described above, the nonvolatile memory device itself manages the write time in accordance with an internal circuit and the operation mode is automatically switched to the verify mode after the end of the write operation. Therefore, control of the write operation involving such a write confirmation becomes simple and, as a result thereof, can be readily facilitated.

The above and other objects and novel features of the present invention will become more apparent from the following detailed description of this specification and the accompanying drawings.

DESCRIPTION OF THE PREFERRED EMBODIMENTS

Figure 1:
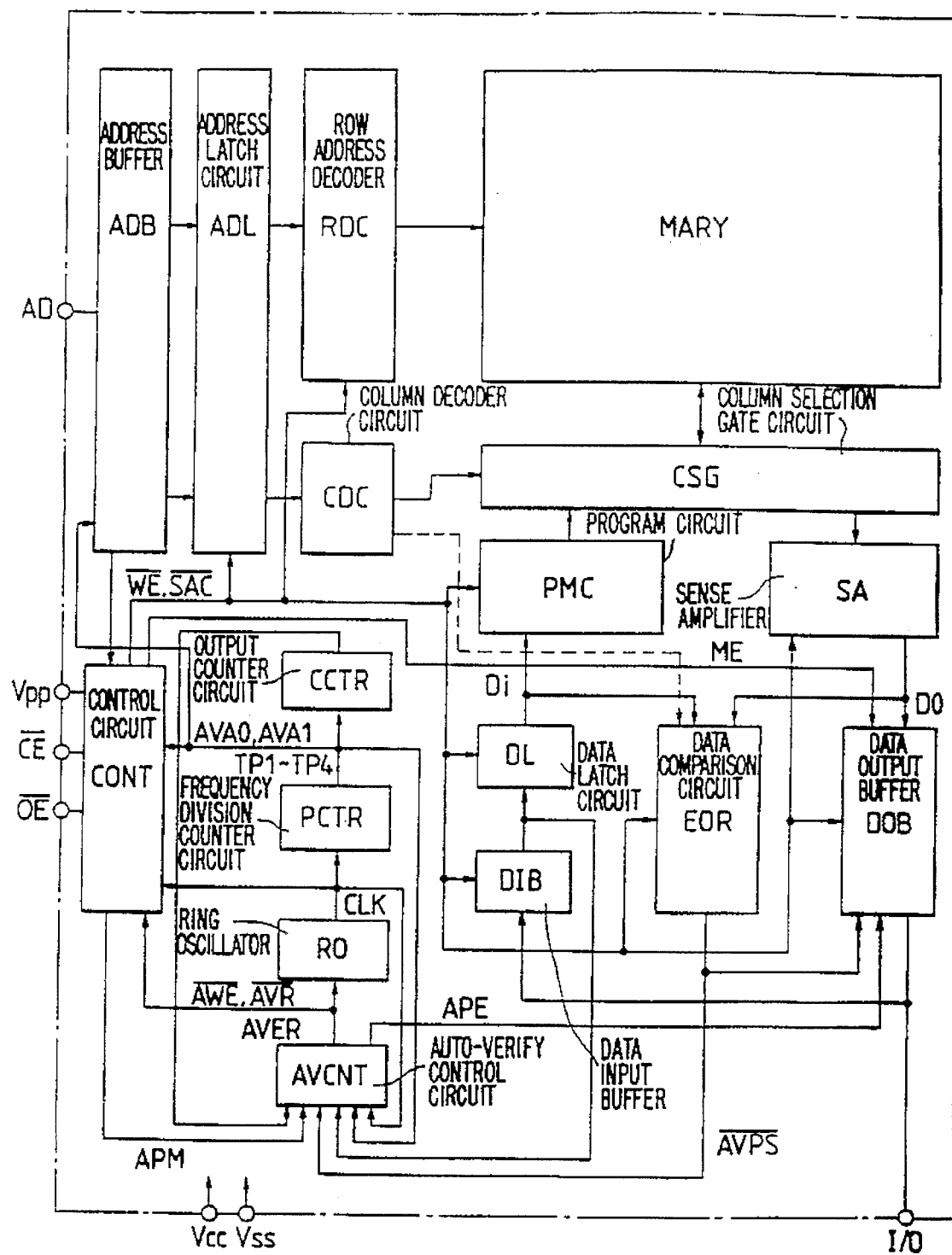
FIG. 1 is a block diagram showing an embodiment of an EPROM in accordance with the present invention.

FIG. 1 is a block diagram showing an embodiment of an EPROM to which the present invention is applied. In the drawing, all of the circuit blocks encompassed by the one dot-chain line are formed on a single or common semiconductor substrate such as single crystal silicon by a known fabrication technique of semiconductor integrated circuitry. In the drawing, each circle "O" represents an external terminal and a plurality of signals (or a plurality of wiring lines) are represented by one signal (or by one line) in order to simplify the drawing.

In the same way as in a heretofore known EPROM, the memory array MARY in the drawing is formed by disposing nonvolatile memory devices (nonvolatile memory elements or cells) of a stacked gate structure having a control gate and a floating gate at the points of intersection between word lines and data lines. The control gate of the memory device is connected to the word line, its drain is connected to the data line and its source is connected to the ground potential point $V_{ss}$ of the circuit. The drawing shows only one bit portion of the memory array MARY described above and the input/output circuit associated with the memory array MARY. Accordingly, when the read operation is made in the unit of a plurality of bits, such as 8 bits, with respect to the entire EPROM, a plurality of sets, such as eight sets, of both the memory arrays MARY and the input/output circuits shown in the drawing are disposed.

Figure 9:
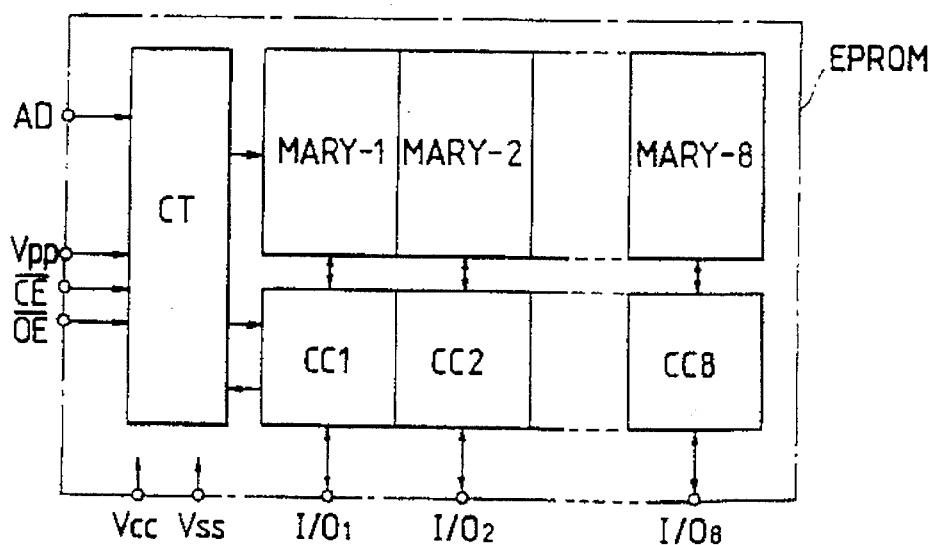
FIG. 9 is a block diagram showing an example of an EPROM in which data input/output is effected in an 8-bit unit.

FIG. 9 shows an example of an EPROM in which the data read operation is made in the 8-bit unit. In the drawing, all of the circuit blocks encompassed by one-dot-chain line are formed on a single or common semiconductor substrate and the circle "O" represents an external terminal thereof. The drawing shows a plurality of signals as one signal for the sake of simplifying the drawing. Symbols $I/O_1$–$I/O_8$ represent external input/output terminals for reading or writing information data in the 8-bit unit. Symbols MARY-1–MARY-8 represent memory arrays, each having the same construction. Symbols CC1–CC8 represent input/output circuits (peripheral circuits), each having the same construction. A control unit, represented by the symbol CT is used commonly for the memory arrays MARY-1–MARY-8 and the input/output circuits CC1–CC8, though this arrangement is not to be considered as being limited thereto. FIG. 1 can be regarded as showing the control unit CT, the input/output circuit CC1 and the memory array MARY-1 which is associated therewith of those shown in FIG. 9. The control unit CT shown in FIG. 1, although not specifically limited thereto, includes the following arrangement of interconnected circuits which will be described subsequently: address buffer ADB, address latch circuit ADL, row decoder circuit RDC, column decoder circuit CDC, control circuit CONT, output counter circuit CCTR, frequency division counter circuit PCTR, ring oscillator RO and auto-verify control circuit AVCNT. The memory array MARY-1, furthermore, is disposed in conjunction with the following arrangement of interconnected circuits, also shown in FIG. 1, which will be described subsequently: column selection gate circuit CSG, program circuit PMC, sense amplifier SA, data latch circuit DL, data input buffer DIB, data comparison circuit EOR and data output buffer DOB. The external input/output terminal thereof can be regarded as corresponding to the input/output terminal I/O of FIG. 1.

An EPROM employed for reading data in accordance with an 8-bit unit is disclosed in U.S. Pat. No. 4,788,665. This U.S. Patent, which is incorporated herein by reference, describes the nonvolatile memory device, too, and also describes a subsequently discussed page program function employed in conjunction with the present invention.

An address buffer ADB receives an address signal supplied from the external terminal and generates an internal address signal. In this embodiment the internal address signal is latched into an address latch circuit ADL which is herein implemented for the auto-verify mode and the like, to be subsequently discussed.

Among the internal address signals, X-system (row-system) address signals are supplied to a row decoder circuit RDC, where they are decoded. Decoding the address signals, the row decoder circuit RDC selects one word line of a plurality of word lines of the memory array MARY in accordance with each row address signal. Y-system (column-system) signals among the internal address signals are supplied to a column decoder circuit CDC, where they are decoded. The column decoder circuit CDC decodes the column address signals and generates data line selection signals. A column selection gate circuit CSG consists of switch MOSFETs which are selectively turned on in accordance with a data line selection signal outputted by the column address decoder CDC. That is, one data line designated by the Y system address signal among the plurality of data lines in the memory array MARY is selectively connected to the common data line through a switch MOSFET in the column selection circuit CSG. In the write operation of the nonvolatile memory device accessed, a relatively high voltage must be supplied to its drain and control gate. Accordingly, the row and column decoder circuits RCD, CDC each have a level conversion function wherein a decode output of a relatively low level of 5 V system is converted to a high level of about 12 V system which is used, for example, during the write operation.

If a page program function for writing simultaneously N bytes of information data is disposed, to be subsequently described, the column selection gate circuit CSG has the structure of connecting a plurality of data lines to a plurality of common data lines. A data latch circuit is disposed in connection with each one of the plurality of common data lines so that after write data is serially (sequentially) transmitted into each latch circuit in connection with the memory array MARY, for example, and with respect to each such memory array of the EPROM, the write signals are supplied in parallel to the plurality of data lines through the column selection gate circuit CSG. As disclosed in the aforementioned U.S. Patent, in such an address structure, the column decoder circuit CDC is divided into first and second column decoder circuits so that the first column decoder circuit generates the selection signal for the column selection gate circuit CSG, and the second column decoder circuit generates the selection signals for the plurality of data latch circuits in the write operation and generates the selection signal for a read gate circuit for selecting one common data line from among a plurality of common data lines in the read operation of each one of the memory arrays of the EPROM, such as memory array MARY in FIG. 1.

The data latch circuit DL is disposed on the common data line. When used only for an auto-verify mode but not for the page program mode described above, the data latch circuit DL is disposed for storing the write data. Therefore, if the EPROM is not disposed with the page program function, such as described above, only one data latch circuit is constituted for at least one memory array MARY or in other words, for at least one external terminal. In contrast, if the page program mode is added, a plurality of data latch circuits are disposed for each memory array of the EPROM which correspond respectively to separate external terminals for inputting/outputting information data.

The data input buffer DIB is used for inputting the write data supplied from the external terminal I/O and for receiving the command data at the time of the auto-verify mode. Accordingly, the output signal of the data input buffer DIB is supplied to an auto-verify control circuit AVCNT besides the data latch circuit DL.

The write data Di as the output signal of the data latch circuit DL and the output signal Do of a sense amplifier SA as the read signal in the auto-verify mode are supplied to a data comparison circuit EOR. The data comparison circuit EOR consists of a coincidence/non-coincidence circuit such as an exclusive-OR circuit, compares the write data and the read data with each other and generates a coincidence/non-coincidence determination signal. In other words, the data comparison circuit EOR compares the data and determines as to whether there is coincidence/non-coincidence in the auto-verify mode.

A ring oscillator circuit RO generates a reference time signal and forms a sequential operation timing signal for the sequential operation timing such as setting of the write time, the shifting from the write operation to the verify mode, and the like.

A frequency division counter circuit PCTR divides the frequency of the basic pulse generated by the ring oscillator circuit RO and generates the write pulse in the write time unit in accordance with the set write condition and a verify pulse for switching the internal circuit to the verify mode. An output counter circuit CCTR counts the write pulses described above and is used substantially for setting a write time.

A control circuit CONT inputs the following signals through the external terminals, though it is not particularly limited thereto. Namely, it receives a high voltage $V_{pp}$ for writing, a chip enable signal $\overline{CE}$ and an output enable signal $\overline{OE}$ and generates various control signals and timing signals necessary for the internal operations.

In this embodiment, a circuit having a high voltage detection function is provided with respect to the external terminal $\overline{CE}$, though it is not particularly limited thereto, and a ternary input signal including a high voltage is supplied thereto from the terminal $\overline{CE}$. The high voltage from this terminal $\overline{CE}$ is used for setting the auto-verify mode.

In the drawing, symbol Vcc represents an external terminal disposed for supplying the power source voltage $V_{cc}$ of the circuit (e.g. 5 V) to each circuit block of the EPROM and symbol $V_{ss}$ represents an external terminal disposed for supplying the ground potential $V_{ss}$ of the circuit to each such block.

Figure 2A:
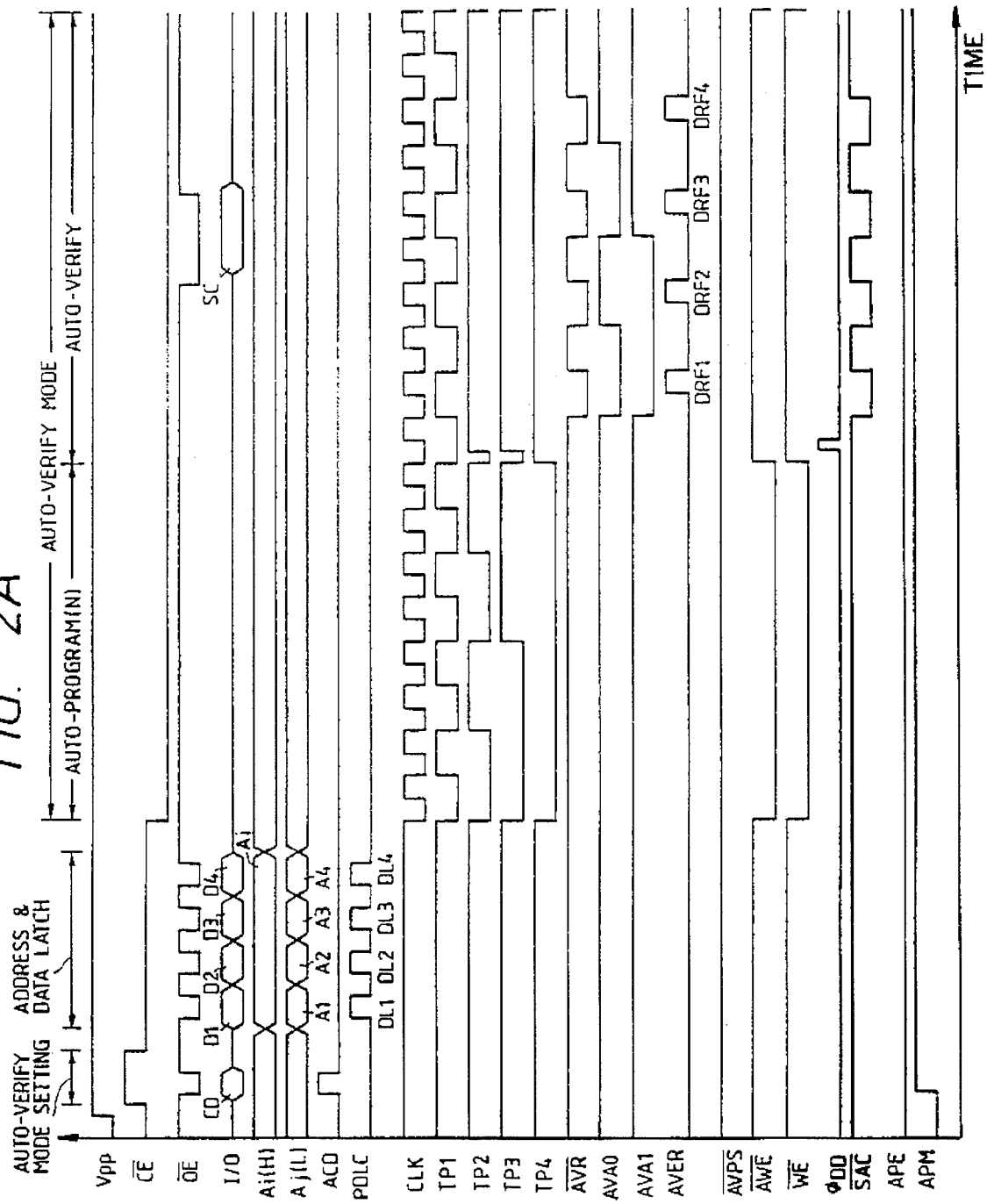
FIG. 2A is a timing chart useful for explaining the procedures of setting of the auto-verify mode to the first write operation and the verify mode.
Figure 2B:
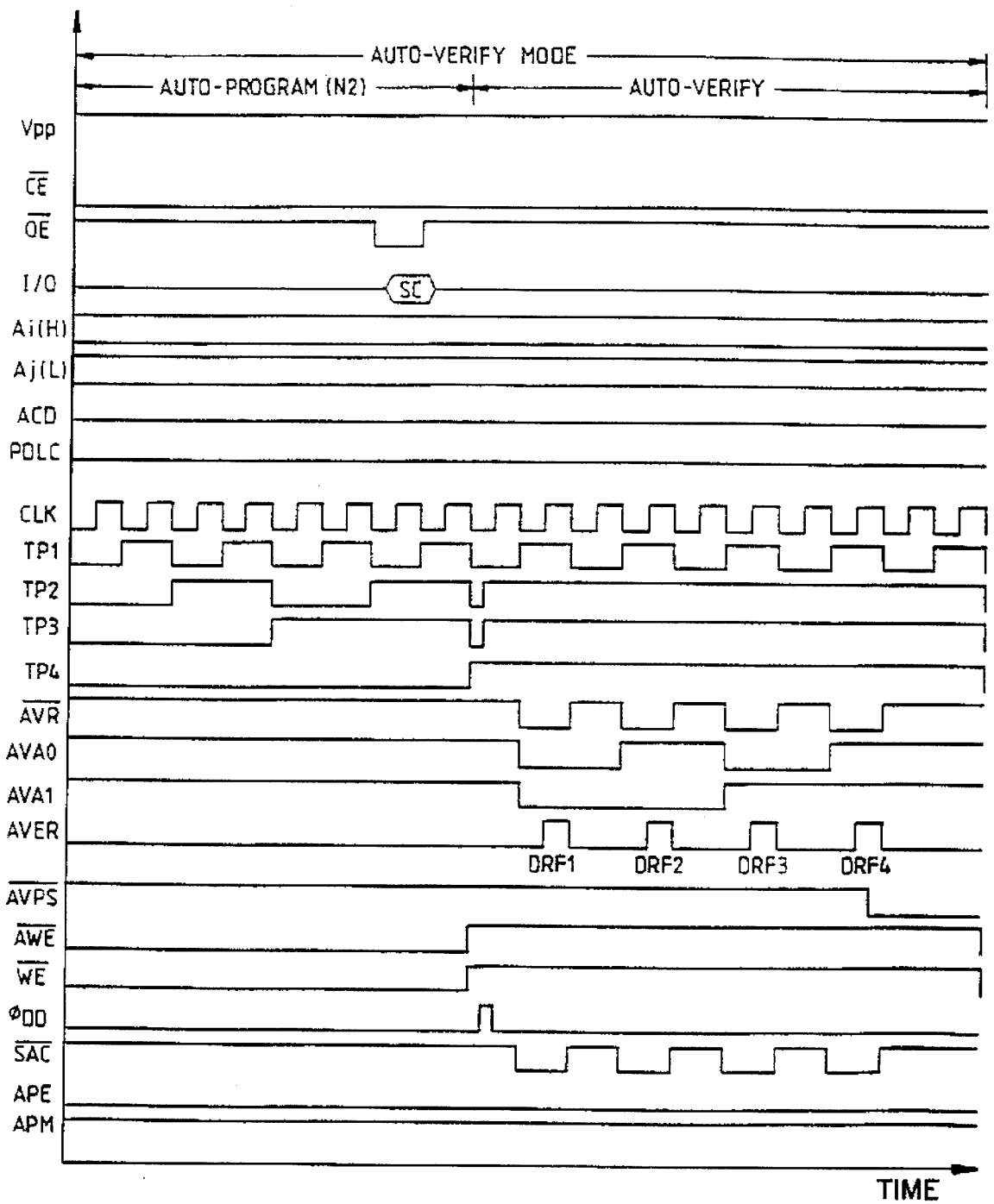
FIG. 2B is a timing chart useful for explaining the second write operation and the verify mode.
Figure 2C:
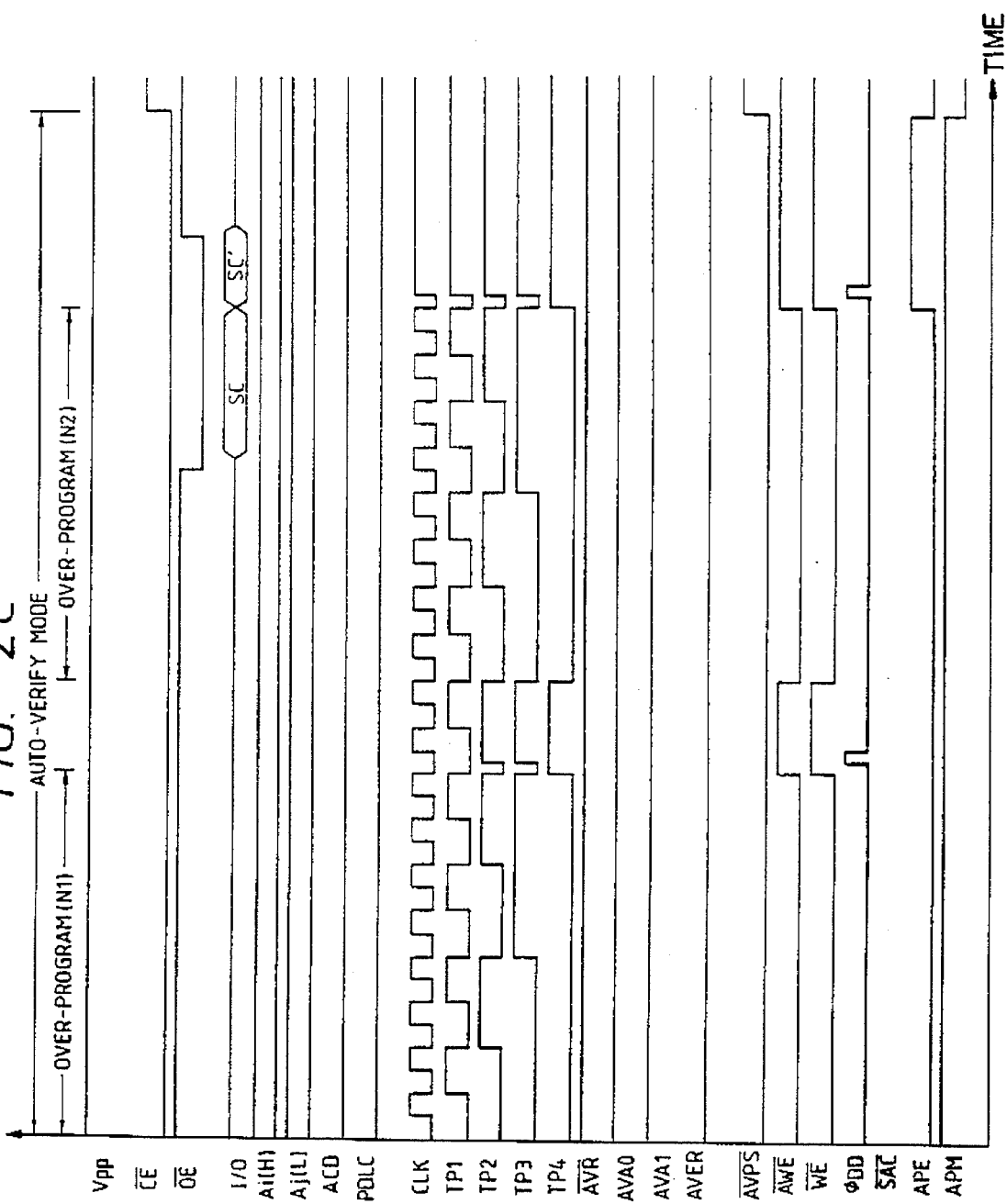
FIG. 2C is a timing chart useful for explaining the additional write operation and the end of the write operation.

In FIG. 1, typical examples of the internal signals generated by each circuit block illustrated are provided with symbols and these symbols are the same as those which are used for the internal signals shown in FIGS. 2A–2C.

FIGS. 2A to 2C show the timing charts which are useful for explaining the auto-verify mode of the EPROM described above.

The control circuit CONT recognizes the auto-verify mode by setting the external output enable signal $\overline{OE}$ to the low level while the external chip enable signal $\overline{CE}$ is kept at a high voltage by applying a high voltage $V_{pp}$ such as approx. 12 V to the external terminal $V_{pp}$. Then, the control circuit CONT asserts an auto-verify command fetch signal ACD and the auto-verify mode signal APM to the high level. Incidentally, the internal signal $\overline{DiC}$ which will be subsequently discussed is asserted to the low level, at this time. Accordingly, a command CD is inputted from the external input/output terminal I/O into the EPROM and fetched into the command latch circuit which will be explained next.

Figure 3:
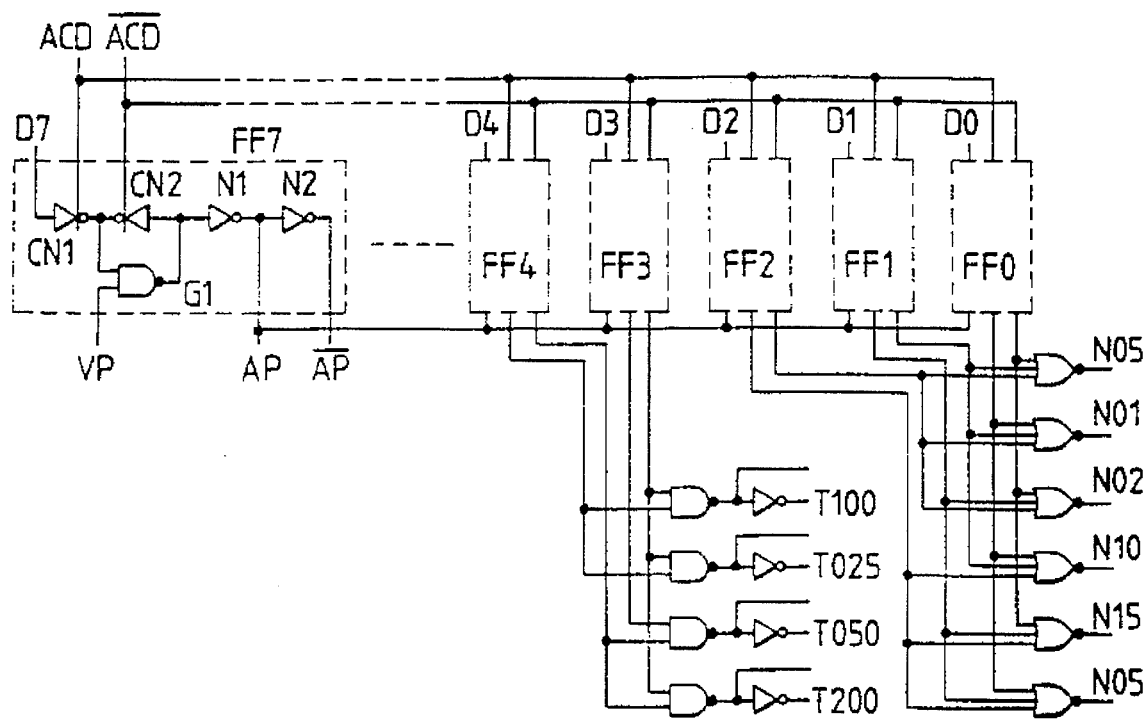
FIG. 3 is a circuit diagram showing an example of a command data latch circuit.

FIG. 3 is a circuit diagram showing an example of the command latch circuit (command register) mentioned above. The drawing depicts an arrangement in connection with an EPROM in which data read-out is performed in accordance with an 8-bit unit. In other words, this EPROM has eight external terminals $I/O_1$–$I/O_8$.

The command latch circuit is disposed in the auto-verify control circuit AVCNT and consists of eight latch circuits FF0–FF7 corresponding to the command data D0–D7 consisting of 8 bits and supplied from the eight input/output terminals $I/O_1$–$I/O_8$. In other words, 1-bit data is supplied from each input/output terminal $I/O_1$–$I/O_8$ to the command latch circuit. In the drawing, a specific circuit arrangement of only the latch circuit FF7 generating auto-verify signals AP, $\overline{AP}$ is shown, as an example, and the other latch circuits FF0–FF4, etc., having the same circuit construction are represented by the dotted lined blocks.

The latch circuit FF7 consists of an input clocked inverter circuit CN1 for receiving the data D7 described above, a data latching (feedback) clocked inverter circuit CN2 and a NAND gate circuit G1 having its output and input connected to the input and output of the clocked inverter circuit CN2, respectively. The inverter circuits N1 and N2 are cascaded to the output portion of the NAND gate circuit to output the signals AP and $\overline{AP}$, described above. The clocked inverter circuits CN1 and CN2 are rendered operative complementarily by the auto-verify command fetch signals ACD and $\overline{ACD}$ that are generated by the control circuit CONT at the time of setting of the auto-verify mode. In other words, when the signal ACD is at the high level (logic "1"), the input clocked inverter circuit CN1 becomes operative and the feedback clocked inverter circuit CN2 becomes non-operative with a high output impedance. When the fetch signal ACD changes from the high level to the low level (logic "0"), the input clocked inverter circuit CN1 becomes non-operative with a high output impedance, its inversion signal $\overline{ACD}$ is raised to the high level and the feedback clocked inverter circuit CN2 becomes operative. Accordingly, the latch operation of the command data D7 which is set to the logic "0" in the auto-verify mode is carried out. Incidentally, a signal VP which is set to the high level in response to the rise of the external terminal $V_{pp}$ to the high voltage for writing is supplied to a NOR gate circuit G1. Accordingly, setting of the auto-verify mode is based on the condition that the external terminal $V_{pp}$ is at the high voltage $V_{pp}$. During the operations other than the write operation where the voltage $V_{pp}$ is 5 V or 0 V, the latch circuit FF7 is reset due to the low level of the signal VP. Incidentally, the signal VP can be generated by a detection circuit connected to the external terminal $V_{pp}$, for example.

The remaining command data D4 and D3 are used for setting the unit write time. In other words, the 2-bit signals D3 and D4 latched by the latch circuits FF3 and FF4 are inputted into the decoder circuit consisting of the NAND gate circuit and the inverter circuit and provide four sets of unit write pulse times, that is, T100, T025, T050 and T200, are set.

The remaining command data D2 through D0 are used for setting the unit write times. In other words, the 3-bit signals D0 through D2 latched by the latch circuits FF0 through FF2 are inputted into the decoder circuit consisting of the NOR gate circuit and substantially, a maximum of six sets of write number of times such as N01 through N15 are set.

Among the remaining 2-bits of command data D5 and D6 (not shown in the drawing), one bit is used as data representing whether or not the outputting of the internal operation state is permitted, as will be described later.

Figure 6:
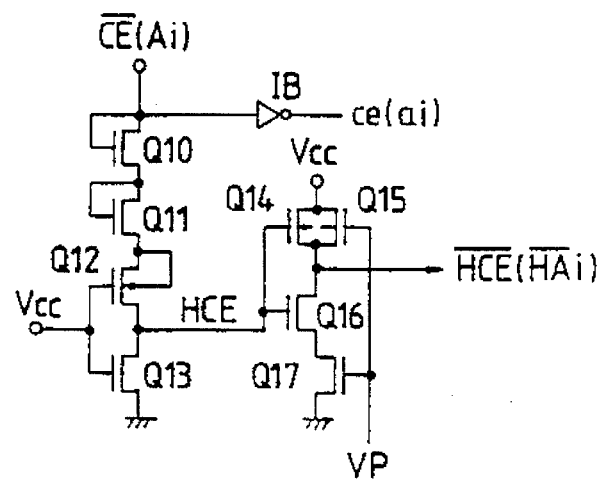
FIG. 6 is a circuit diagram showing an example of a high voltage detection circuit.

FIG. 6 shows a circuit diagram of an example of a high voltage detection circuit used for setting the auto-verify mode, described above.

The external terminal $\overline{CE}$ is connected at one of its ends to the input terminal of the input buffer IB and an internal signal ce is generated at an output of the input buffer.

The terminal $\overline{CE}$ is connected at its other end to the input terminal of the following high voltage detection circuit in order to permit the ternary input. In other words, the voltage signal supplied from the terminal $\overline{CE}$ is level-shifted through MOSFETs Q10 and Q11 which are in a diode form connection (common connection of gate-to-drain) and is used as an operation voltage of a CMOS inverter circuit consisting of a P-channel MOSFET Q12 and an N-channel MOSFET Q13. The power source voltage $V_{cc}$ is steadily supplied to the gates of MOSFETs Q12 and Q13 forming the CMOS inverter circuit and which circuit is not to be considered as being limited thereto. The conductance of N-channel MOSFET Q13 is set to a relatively small value. Accordingly, when the terminal $\overline{CE}$ is at a relatively low level such as the power source voltage $V_{cc}$, P-channel MOSFET Q12 is turned OFF and the output signal HCE is lowered to a low level, such as the ground potential of the circuit, via the channel of MOSFET Q13. In contrast, when a high voltage above the power source voltage $V_{cc}$ is supplied to the terminal $\overline{CE}$, MOSFETs Q10, Q11 and the operation voltage through these transistors are set to their threshold voltages so that P-channel MOSFET Q12 is turned ON and the output signal HCE is set to the high level in accordance with the conductance ratio between the composite conductance of the P-channel MOSFET Q12 and the conductance ratio of the N-channel MOSFET Q13 which is turned ON by the power source voltage supplied to the gate. This signal HCE is supplied to the gates of MOSFETs Q14 and Q16 as one of the inputs of the NAND gate circuit consisting of P-channel MOSFETs Q14, Q15 and N-channel MOSFETs Q16, Q17. The control signal VP, representative of the potential $V_{pp}$ at the external terminal $V_{pp}$ being at the high voltage $V_{pp}$ for writing, is applied to the gates of MOSFETs Q15 and Q17 as the other input (enabling input) of the NAND circuit. Accordingly, when the high voltage $V_{pp}$ is supplied to the external terminal $V_{pp}$ and the mode is that of the write state, the output signal of the high voltage detection circuit disposed at the external terminal $\overline{CE}$ becomes effective.

Besides the control signal terminal, such as described above, the high voltage detection circuit may be disposed at specific address terminals Ai, represented by parentheses in the drawing, so that the ternary potential input is made as the address signals and can be used for setting various modes.

In FIG. 2A, when the page program mode is set in addition to the auto-verify mode for reducing the write time, the write data are inputted serially in the following way. Setting of the page program mode can be made by use of the remaining 1-bit command data, described above, or by the combination of the potentials at the external terminals $\overline{CE}$ and $\overline{OE}$.

When the page program mode is set as described above, the address signal is supplied to the external address terminal by use of the low level of the external output enable signal $\overline{OE}$ as the clock and at the same time, the write data D1 through D4 are supplied serially to the input/output terminal I/O. In other words, the page program data latch control signal PDLC is generated by the control circuit CONT in synchronism with the low level of the external signal $\overline{OE}$ and the data latch signals DL1 through DL4 are generated in accordance with the address signal Aj on the basis of the control signal PDLC. In other words, the address signal Ai(H) of the upper order bit is used as the predetermined address signal, and the data latch signals DL1 through DL4 are generated in response to the addresses A1 through A4 designated by the lower order 2-bit address signals Aj(L). These data latch signals designate the data latch circuit and the write data D1 through D4 are fetched by the designated data latch circuit. As a result, the write data D1 through D4 are serially fetched into each data latch circuit.

Figure 5:
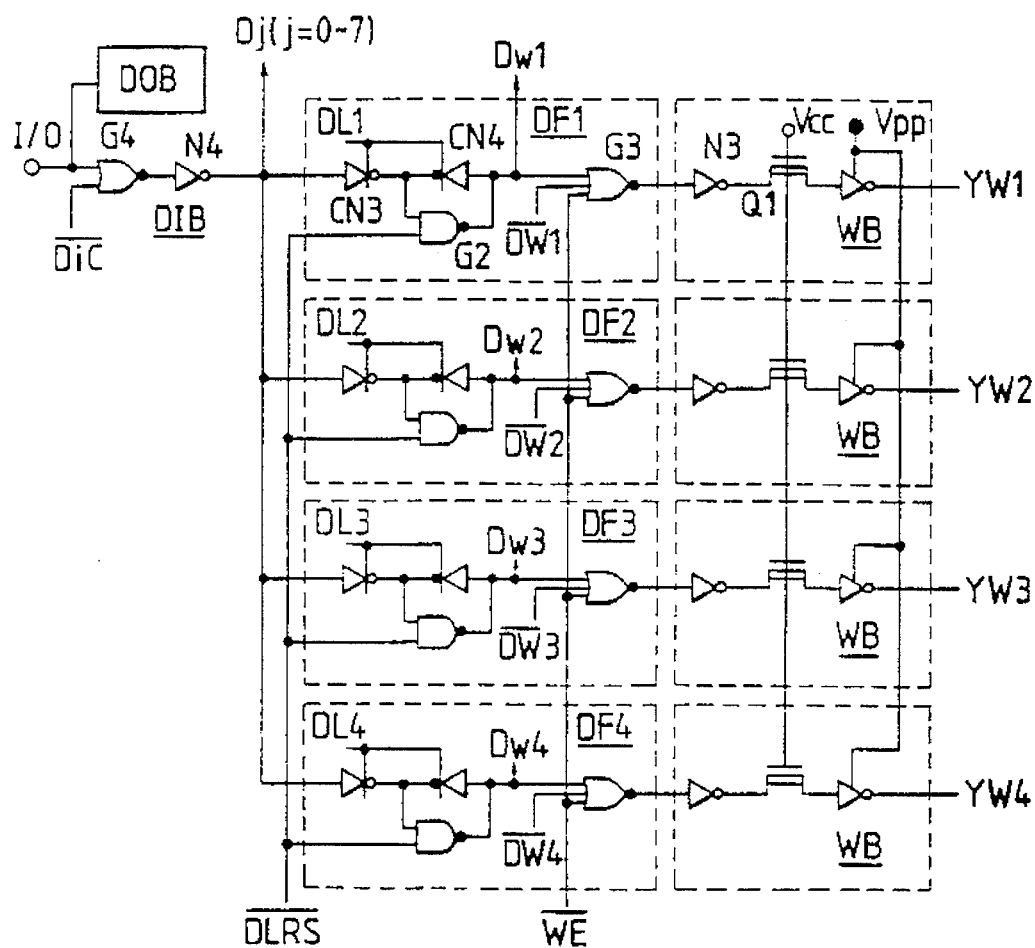
FIG. 5 is a circuit diagram showing an example of the data latch circuit used for a page program.

FIG. 5 shows a circuit diagram of an example of the data input buffer DIB described above and data latch circuits DF1–DF4 and a write amplifier WB used for the program mode, described above.

The 1-bit external terminal I/O is connected at one of its ends to one of the inputs of the NOR gate circuit G4 forming the data input buffer DIB. The control signal $\overline{DiC}$ is applied to the other input of the NOR gate G4. Accordingly, when the control signal $\overline{DiC}$ is at the low level (the logic "0"), the operation of the data input buffer DIB consisting of the NOR gate circuit G4 becomes effective and its output signal is commonly supplied to the input terminals of the data latch circuits DF1–DF4 through the inverter circuit N4. The external terminal I/O is connected, on the other hand, to the output terminal of the data output buffer DOB.

As described in the above-mentioned U.S. Patent, the memory array MARY or each such memory array in the EPROM, for example, is divided into a plurality of memory blocks (four memory blocks in this embodiment) in order to enable the page program. The data latch circuits DF1 through DF4 are disposed in such a manner as to correspond to the divided memory blocks, respectively. The data latch circuit DF1 corresponding to one memory block consists of an input clocked inverter circuit CN3, a data holding (feedback) clocked inverter circuit CN4 and a NAND gate circuit G2 whose output and one of the inputs of which are connected to the input and output of the clocked inverter circuit CN4, respectively. An output circuit consisting of a NOR gate circuit G3 is disposed at the output portion of the data latch circuit. The clocked inverter circuits CN3 and CN4 are operated complementarily by the data latch signal generated in time series (sequentially) in accordance with the address signal Aj in the page program mode. In other words, when the data latch signal DL1 is at the high level, the input clocked inverter circuit CN3 is operative and the feedback clocked inverter circuit CN4 is inoperative with a high output impedance. When the data latch signal DL1 changes from the high level to the low level, however, the input clocked inverter circuit CN3 becomes inoperative with a high output impedance and the feedback clocked inverter circuit CN4 becomes operative and holds the data fetched. The data latch circuits DF2 through DF4, disposed so as to correspond to the other memory blocks of the memory array, have the same type of circuit construction, but their control signals are the data latch signals DL2 through DL4, respectively.

A data reset signal $\overline{DLRS}$ is supplied to the other input of the NAND gate circuit G2 or the like forming the latch circuit DF1–DF4. In other words, when this signal $\overline{DLRS}$ is at the low level, the outputs of each of the NAND gate circuits G2, or the like, are at the high level irrespective of the held data and all the latch circuits DF1 through DF4 are reset.

Data write control signals $\overline{DW1}$ through $\overline{DW4}$ that are generated in the normal program mode are respectively supplied to the second inputs of the NOR gate circuits G3 of the latch circuits DF1 through DF4. A write enable signal $\overline{WE}$ is supplied to the third input of each of the NOR gate circuits G3, or the like. Accordingly, each of the NOR gate circuits G3, disposed at the output portion of each latch circuit DF1–DF4 is made substantially operative in the write mode where the write enable signal $\overline{WE}$ is at the low level.

The data write control signals $\overline{DW1}$–$\overline{DW4}$ are generated by the control circuit CONT and are all at the low level in the page program mode. They are selectively set to the low level in accordance with the lower order 2-bit address signals Aj(L), for example, in the normal program mode. In other words, the data write control signal that is designated by the lower order 2-bit address signal is set to the low level and the other of the data write control signals are at the high level.

Incidentally, whether the mode is the normal program mode or the page mode is determined in the control circuit CONT.

In the page program mode, all the signals $\overline{DW1}$–$\overline{DW4}$ are at the low level. Therefore, the data latched by the latch circuits DF1–DF4 are respectively transferred to the corresponding data lines through the corresponding write amplifier WB and exclusive write operation (page program) in the 4-bit information data unit (4-byte information data unit in the EPROM shown in FIG. 9) is conducted. In the normal program mode, all the signals DL1–DL4 are at the high level. Therefore, the write data is transmitted through each latch portion and only the NOR gate corresponding to one data write control signal $\overline{DWi}$ (i=1–4) which is set to the low level in accordance with the address designation information opens the gate so that the write data is transferred to the corresponding data line through the write amplifier WB and normal write operation in the 1-bit information data unit (1-byte information data unit corresponding to the entire EPROM shown in FIG. 9) is conducted.

Though not particularly limited thereto, the write amplifier consists of the following circuits and interconnections thereof. The output signals of the data latch circuits outputted from the respective NOR gate circuits G3, or the like, are respectively supplied to the input inverter circuits N3 of a corresponding write amplifier. The output signal of each one of the inverter circuits N3, or the like, of each write amplifier is transferred to the input of an output amplifier thereof for generating switch control signals YW1–YW4, via the source-drain path of a depletion type N-channel MOSFET Q1, or the like, which receives a constant gate bias voltage corresponding to the power source voltage $V_{cc}$. The output amplifier has the level conversion function of converting the relatively low level signal amplitude of the power source voltage $V_{cc}$ to the high level signal amplitude, such as the high voltage $V_{pp}$, in accordance with providing signals YW1–YW4. These switch control signals YM1, etc. are used as the switch control signals of write MOSFETs which controllably apply the high voltage $V_{pp}$ to the corresponding common data line.

When the output signal from the data latch circuit DF1 is at the high level, for example, the output signal of the input inverter circuit N3 is at the low level and a high level output signal such as the high voltage $V_{pp}$ is generated through the output amplifier. Accordingly, the high level write signal is supplied to the corresponding data line. In contrast, when the output signal from the latch circuit DF1 is at the low level, the output signal of the input inverter circuit N3 is at the high level and the depletion type MOSFET Q1, or the like, is turned OFF. Accordingly, the input signal of the output amplifier rises to the high voltage $V_{pp}$ and a low level signal such as the ground potential of the circuit is generated.

The write data latched by the data latch circuits DF1–DF4 are taken out and supplied to the data comparison circuit EOR thereby supplying the data which are to be written in the memory array to the data comparison circuit at the time of verify operation. The write data Dw1–Dw4 are taken out from the output nodes such as the AND gate circuit G2 and the like, though not being particularly limited thereto. The write data are selected by a ¼ selector which is associated with the data comparator EOR and the write data thus selected by the selector and one read data read out from the sense amplifier SA are compared with each other by a comparator of the data comparator EOR. To make this selection, a switch circuit or selector (not shown) for making the ¼ selection in accordance with the output of the column decoder CDC is disposed in the data comparator EOR. That is, the selector receives the write data control signals Dw1–Dw4 from the data latch circuits DF1–DF4, shown in FIG. 5, and the output signals from column decoder CDC shown in FIG. 1. In the verify operation, this selector selects one of the write data control signals Dw1–Dw4 in accordance with the output signals of column decoder CDC and provides the selected write data as an input signal to the comparator. This comparator compares the provided write data with the read out data from the sense amplifier associated therewith in the verify operation.

The data to the command register is taken out from the output node of the inverter N4, though it is not specifically limited thereto, and is supplied to the command register. Although it is not specifically limited thereto, the command data supplied to the external input/output terminal I/O$_1$ is supplied as the command data D0 of the command data latch circuit FF0. Similarly, the command data supplied to the external input/output terminals I/O$_2$ through I/O$_8$ are supplied as the command data D$_1$ through D$_7$ to the command register described above.

In FIG. 2A, after the address signal is latched by the address latch circuit ADL and the write data are latched by the data latch circuit DF1–DF4, the operation mode is set to the auto-program mode if the external terminal $\overline{CE}$ is set to the low level and the first write operation is effected; however, it is not necessarily limited to this arrangement.

Incidentally, the address signals other than the lower order 2-bit address signal Aj(L) described above or, in other words, the address signals other than the address signal that designates the data latch circuit for the page program, may, for example, be latched in the address latch circuit ADL.

The operation of the ring oscillator RO commences in response to the change of the external signal $\overline{CE}$ to the low level whereby, as a result of which, the clock pulse CLK is generated. Receiving this clock pulse CLK, a frequency division counter circuit PCTR generates count outputs TP1 through TP4 consisting of 4 bits, for example, and transfers them to the control circuit CONT. The control circuit CONT generates an auto-verify write enable signal $\overline{AWE}$ from the write time signal set by the command latch circuit and from the count outputs TP1 through TP4.

Although it is not to be considered as being limited thereto, one of the count outputs TP1–TP4 is selected in accordance with the value set to the command latch circuit and the auto-verify write enable signal $\overline{AWE}$ which has the low level period, corresponding to the low level period of the selected count output, is generated. When the signal TO25 in FIG. 3 is at the high level, for example, the signal $\overline{AWE}$ having the low level period corresponding to one low level period of TP1, described above, is generated. Similarly, the signal $\overline{AWE}$ having the low level period corresponding to one low level period of each of TP2, TP3 or TP4 is generated for each of the signals TO50, T100 and T200.

This embodiment represents the example where the time corresponding to either periods of the clock pulse CLK is set as the write time. In other words, it represents the case where the command data which sets the signal T200 to the high level is set. The internal write enable signal $\overline{WE}$, too, is set to the low level in response to the signal $\overline{AWE}$. In other words, the internal signal $\overline{WE}$ is substantially in synchronism with the signal $\overline{AWE}$.

The auto-verify write enable signal, as an alternative, can be generated by the auto-verify control circuit AVCNT but, which corresponds to that shown in FIG. 1.

In this manner, the auto-program N1 wherein the fetched data D1 through D4 are simultaneously written is executed.

When the write time, described above, or the predetermined write time determined by the low level period of the auto-verify write enable signal $\overline{AWE}$ has ended, the control circuit CONT generates the pulse $\phi_{DD}$. Accordingly, the potential of the data line that is set to the high potential for writing is removed at a high speed by a write data line potential extraction pulse $\phi_{DD}$ in order to prepare for the read operation. After extraction of the potential described above, the auto-verify read signal $\overline{AVR}$ is asserted to the low level.

This auto-verify read signal AVR is inputted to the counter circuit and the auto-verify signals AVA0 and AVA1 consisting of 2 bits, which correspond to the lower order 2-bit address signals Aj of the page program mode are, generated. An auto-verify comparison data fetch clock AVER is generated from the auto-verify read signal $\overline{AVR}$, described above, and the clock pulse CLK. The address signals AVA0 and AVA1 are decoded by the decoder circuit (not shown in the drawings) and data latch selection pulse signals DRF1 through DRF4 in synchronism with the clock AVER are generated in a time series (sequentially). Accordingly, the data Dw1 through Dw4 fetched in the data latch circuits DF1–DF4 are selected. As described already, this selection is made by the data comparison circuit EOR. However, this selection may of course be made in the data latch circuit DL (Including DF1–DF4).

A sense amplifier activation signal $\overline{SAC}$ is generated in synchronism with the auto-verify signal $\overline{AVR}$ and one bit of the 4-bit read signal designated by the address signal Ai which is fetched by the address latch circuit ADL is designated by the decode outputs of the address signals AVA0 and AVA1. The data comparison circuit EOR compares this designated read data with the output from among the outputs Dw1–Dw4 from the data latch circuits DF1–DF4 designated by the address signals AVA0 and AVA1. If they coincide with each other or if write of desired data to a memory cell is confirmed, the data comparison circuit EOR sets the auto-verify pass signal $\overline{AVPS}$ to the low level.

Incidentally, it is also possible to supply the auto-verify address signals AVA0, AVA1 to the column decoder CDC through the address latch circuit ADL, to decode these address signals in the column decoder CDC and to use the selection signals obtained by decoding as the data latch selection signals DRF1–DRF4. In this case, this selection signal may be supplied from the column decoder CDC to the data comparison circuit EOR as represented by dash line in FIG. 1. Needless to say, the output of the column decoder CDC is supplied, in this case, to the column selection gate circuit CSG so that among the read signals consisting of 4 bits those which are designated by the address signals can be supplied to the sense amplifier SA.

FIG. 2A shows an example where the write data and the read data are not coincident. In FIG. 2A, when the signal $\overline{OE}$ is set to the low level at a suitable timing, the internal state SC is outputted in the interim from the terminal I/O. In this internal state SC, the contents of the set command CD described above and the operation sequence can be outputted. Accordingly, a microprocessor MPU, to be discussed subsequently, can read and monitor the operation state of the EPROM at a suitable timing. The read operation of the internal state SC will be explained later in detail with reference to FIG. 8.

When the internal auto-verify pass signal $\overline{AVPS}$ is at the high level as described above, the second write operation N2 is effected in response thereto as shown in FIG. 2B.

In FIG. 2B, the auto-verify write enable signal $\overline{AVE}$ ( $\overline{WE}$) is again set to the low level after the auto-verify described above, the write operation is effected for the period set by the command data D3 and D4 in the same way as in FIG. 2A, and the potential of the data line which is raised to the high potential with the end of the write operation is removed at a high speed by a write data line potential extraction pulse $\phi_{DD}$ to prepare for the read operation. After the removal of the potential described above, the auto-verify read signal $\overline{AVR}$ is again asserted and the auto-verify mode similar to the one described above is executed.

When the pass signal $\overline{AVPS}$ is asserted to the low level by this auto-verify mode, an over-program mode such as shown in FIG. 2C is successively executed in response to the assertion of this pass signal $\overline{AVPS}$ because the write operation to the memory cell is confirmed.

In the over-program (run-on write) of this embodiment, the write operation is made for the same time as the time required for the write operation described above. Therefore, when the write operation is confirmed twice as described above, the over-programs (run-on write) N1 and N2 for two times of the write operation are executed. Since the command data D3 and D4 are not changed, the write operation made in the single over-program is effected for the same time as the write time in the auto-program. An auto-program end signal APE is outputted in response to the end of this over-program operation and the unit auto-verify mode is complete. If the read operation of the internal state is made by setting the external output enable signal $\overline{OE}$ to the low level at the time when the auto-verify mode is ending, the status information outputted at the time when the auto-verify mode is ending changes from SC to SC'.

The unit write operation and verify operation, such as described above, are repeated until the auto-verify pass signal $\overline{AVPS}$ is outputted with the maximum number of write times set by the command data D0 through D2 being the limit. When the write operation is confirmed, the number of times run-on write is made corresponds to the number of times of the unit write operation. The counter circuit CCTR counts the number of times the write operation occurs and when this number exceeds the number of times set in advance to the command latch circuit, the control circuit CONT determines that the write operation is no longer possible and outputs a memory end signal ME containing the result determined through the data output buffer DOB. The counter circuit CCTR counts the number of times of occurrence of the auto-verify write signal $\overline{AWE}$ in the period in which the auto-verify pass signal $\overline{AVPS}$ is negated to the high level, for example, and thus counts the number of times of the write operation. In the control circuit CONT or in the auto-verify control circuit AVCNT, the count value by the counter circuit CCTR and the number of times that the write operation is set to the command latch circuit are compared by, for example, a comparison circuit (not shown), and a signal containing the result of this comparison is outputted as the memory end signal ME. This memory end signal ME is outputted so as to contain the content in the case where the write operation is completed normally as described above.

Figure 8:
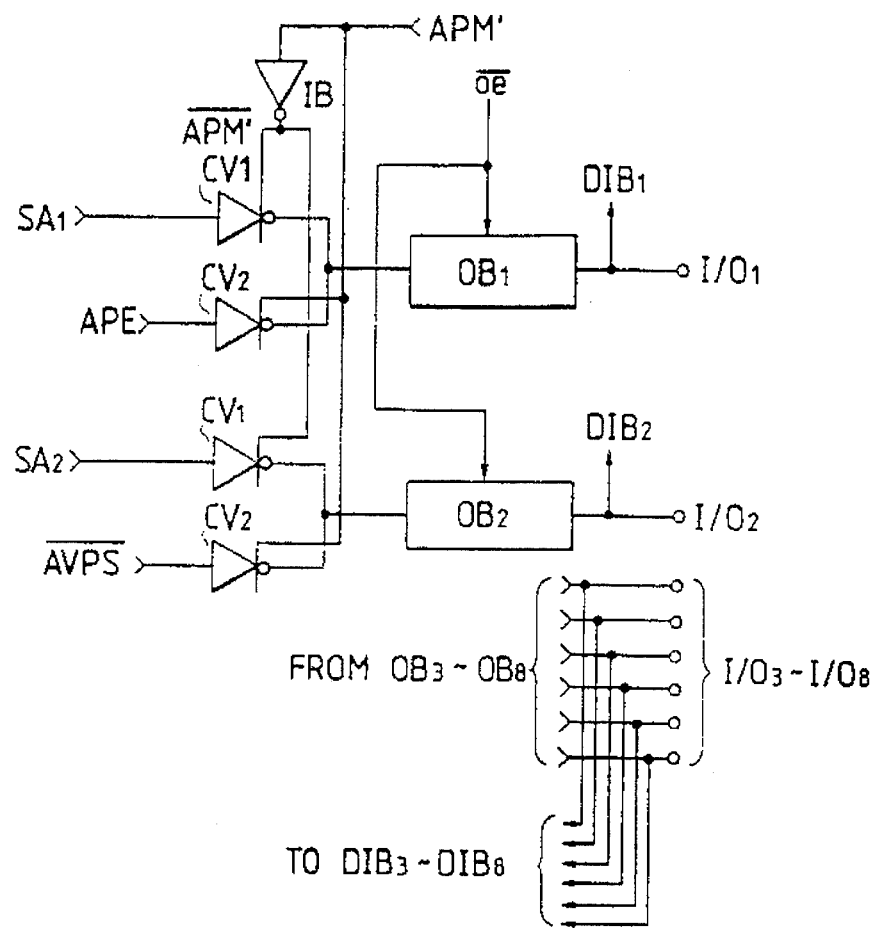
FIG. 8 is a circuit diagram showing an example of a data output buffer.

When the internal state SC is outputted, too, it is outputted from the control circuit CONT or the auto-verify control circuit AVCNT through the data output buffer DOB. Accordingly, a multiplexer circuit is disposed at the input portion of the data output buffer DOB as shown in FIG. 8, and the read signal from the sense amplifier SA, the output of the internal state described above, the auto-verify end signal described above, and the like, are outputted selectively in accordance with its operation mode.

In FIG. 9, the auto-program end signal APE and the auto-verify pass signal $\overline{\text{AVPS}}$ can be outputted from the external input/output terminals I/O$_1$, I/O$_2$ in the auto-verify mode. In other words, the clocked inverter CV$_2$ is made operative by the signal APM' based on the internal signal APM which is set to the high level when the mode is set to the auto-verify mode, and the signals APE and $\overline{\text{AVPS}}$ described above are transferred to the output buffers OB$_1$ and OB$_2$. These output buffers OB$_1$ and OB$_2$ output the signals corresponding to the signals APE and $\overline{\text{AVPS}}$ to the input/output terminals I/O$_1$ and I/O$_2$ when the internal enable signal $\overline{\text{oe}}$ based on the external signal $\overline{\text{OE}}$ is set to the low level. When the operation mode is not set to the auto-verify mode, on the other hand, the signal APM' is at the low level. Accordingly, the clocked inverter CV1 becomes effective and the outputs of the sense amplifiers SA$_1$ and SA$_2$ are outputted to the input/output terminals I/O$_1$ and I/O$_2$ through the output buffers OB$_1$ and OB$_2$. A clocked inverter analogous to the clocked inverters CV$_1$ and CV$_2$ described above is disposed so as to output the memory end signal ME from the external input/output terminal I/O$_3$.

In fact, the three kinds of signals thereof need not always be outputted and, moreover, more than three kinds of signals can be outputted. Furthermore, the signal AP may be used in place of the signal APM described above. In the drawings, symbols I/O$_3$–I/O$_8$ represent the above-mentioned external input/output terminals and DIB$_1$–DIB$_8$ represent the input buffers. Symbols OB$_1$–OB$_8$ represent the output buffers in the data output buffers DOB$_1$–DOB$_8$.

As described above, since the signals based on the signals APE, $\overline{\text{AVPS}}$, (ME) are outputted to the external input/output terminals I/O$_1$, I/O$_2$, (I/O$_3$) in such an auto-verify mode, the internal state SC, SC' of the EPROM at that time can be ascertained from outside. In other words, when the EPROM is in the write operation, it is possible to determine the end of the write operation, that is, when it becomes impossible to continue the write operation, and the like, from the signals (internal state) that are outputted to the outside.

Figure 4:
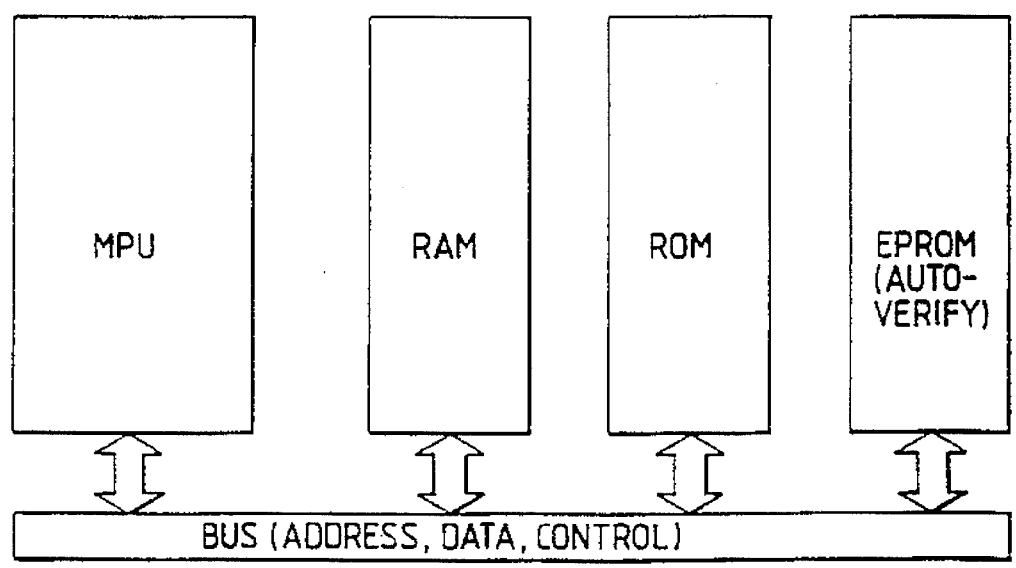
FIG. 4 is a schematic block diagram of an example of a microcomputer system using an in accordance with the present invention.

FIG. 4 shows a schematic block diagram of an example of a microcomputer system to which an EPROM, such as, of the embodiment described above is mounted.

A RAM (Random Access Memory), a ROM (Read-Only Memory) and an EPROM are connected through buses BUS with the microprocessor MPU being the center. The buses BUS include an address bus for transferring the address signals generated by the microprocessor MPU, data buses for exchanging the data between the devices and a control bus for transferring the control signals. The EPROM in this embodiment is equipped with the auto-verify function, such as described above, and has an unwritten memory area.

If the microcomputer system consists of a board structure, for example, each of the microprocessor MPU, RAM, ROM and EPROM components of the microcomputer system is mounted to a mounting substrate such as a printed substrate. Accordingly, the power source circuit for generating the high voltage V$_{pp}$ for writing is mounted to the mounting substrate to which EPROM is mounted. It is possible to use, as this power source circuit, a circuit which generates a relatively low voltage of 5 V and a high voltage of about 12 V by utilizing a charge pump circuit, or the like. The write control circuit is also disposed on the mounting substrate of the EPROM, though it is not specifically limited thereto. This write control circuit generates the control signals $\overline{\text{CE}}$ and $\overline{\text{OE}}$ for setting the afore-mentioned auto-verify mode when the write operation is designated from the microprocessor MPU. When the microprocessor continuously designates a writing operation in accordance with the address it transmits to the EPROM, the page program mode is thus designated in order to shorten the write time. Accordingly, the write control circuit sets the corresponding page program mode of the EPROM in accordance with the instruction from the microprocessor MPU.

Among the address signals supplied from the microprocessor MPU, the upper order address signal Ai is latched in the latch circuit as previously described and the 4-byte information data are inputted serially in accordance with the lower order address signals. When viewed from the microprocessor MPU, the input of such data is effected in the same way as the write operation to the RAM. After the input of such data, the write control circuit maintains the chip enable signal $\overline{\text{Ce}}$ at the low level so that the EPROM can execute the afore-mentioned auto-verify mode.

Accordingly, the microprocessor MPU can execute other data processing operations by gaining access to the RAM and ROM in the interim. For example, when the auto-program end signal APE is generated within the EPROM and the unit auto-verify mode is completed, an interruption occurs wherein the microprocessor MPU promotes access to the EPROM so that the MPU can be notified that the write operation of the EPROM has either ended or that the EPROM can no longer write information data. That is, when the auto-program end signal APE is generated, a signal on the basis of this auto-program end signal APE is supplied to the microprocessor MPU as an interrupt request signal from the EPROM. The microprocessor MPU executes the predetermined interrupt process program in response to the interrupt request signal. In executing this predetermined interrupt program, the microprocessor accesses the EPROM and detects the internal state of the EPROM, for example, as to whether the writing operation has ended or that the EPROM can no longer write information data. In this manner, through-put of the system can be improved drastically. It is also possible to dispose buffer memories consisting of the RAM type or the like on the mounting substrate of the EPROM, to write a series of data into them from the microprocessor and to write the data continuously into the EPROM.

As described above, the microprocessor MPU can always read and know the internal operation state of the EPROM by setting the output enable signal $\overline{\text{OE}}$ to the low level when the EPROM is in the auto-verify mode. The microprocessor MPU may know the state of EPROM by polling.

In an EPROM equipped with the auto-verify function such as the EPROM of this embodiment, the write operation from the microprocessor can be made easily as described above. Accordingly, in comparison with conventional EPROMs in which the write operation is made exclusively by an EPROM writer before it is mounted to the system, the present invention can enlarge the application range. For example, the data that are to be processed by the microprocessor MPU and to be made nonvolatile can be preserved easily by utilizing the nonvolatility feature of the data stored in an EPROM.

Figure 7:
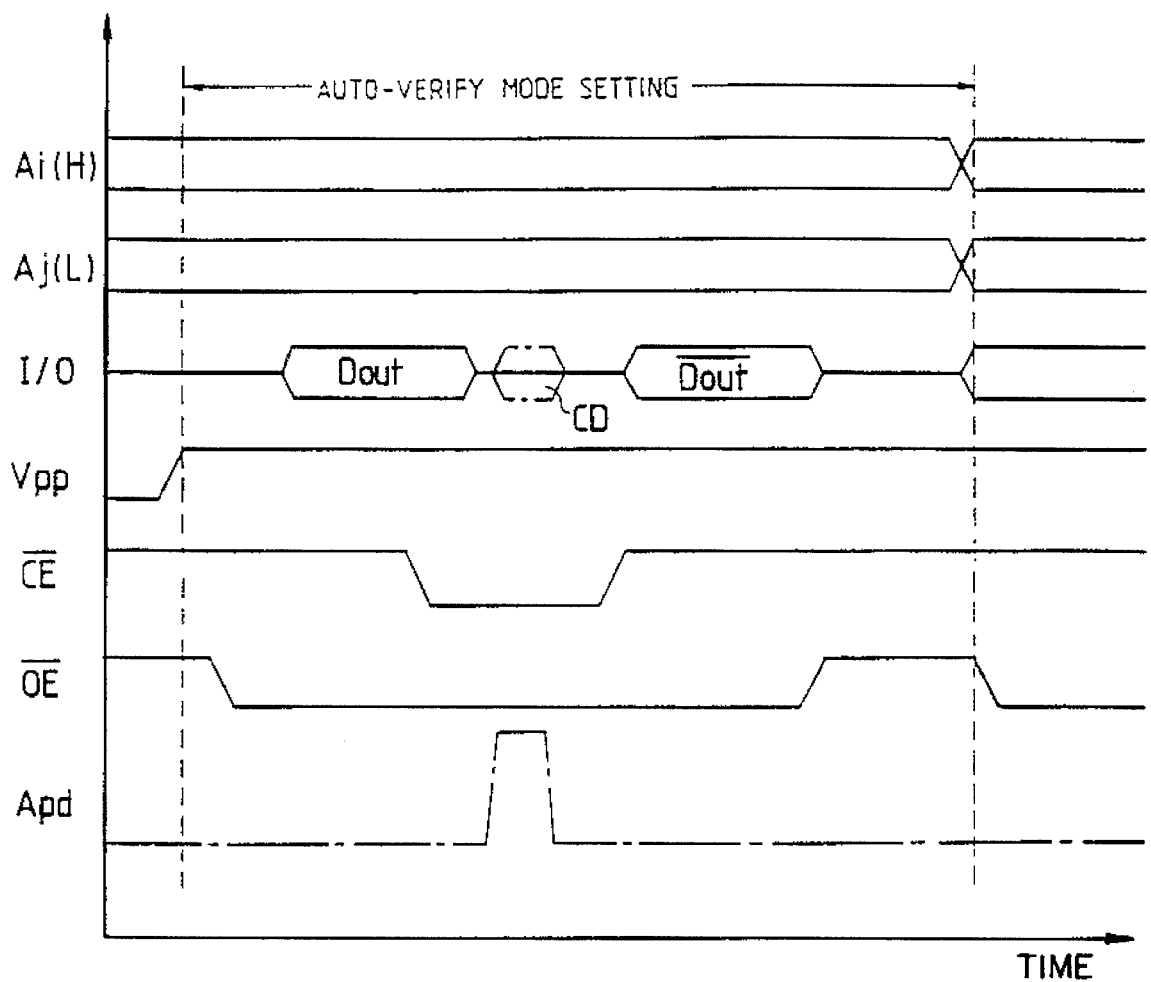
FIG. 7 is a timing chart showing another embodiment of the present invention.

FIG. 7 shows a timing chart of still another embodiment of the present invention. In this embodiment, setting of the auto-verify mode is effected at the timing of the chip enable signal $\overline{\text{CE}}$ and the output enable signal $\overline{\text{OE}}$. In other words, as shown in FIG. 7, the control circuit CONT shown in FIG. 1 recognizes the auto-verify mode by the change of the chip enable signal $\overline{CE}$ from the high level to the low level and then again to the high level during the period in which the output enable signal $\overline{OE}$ is at the low level. Recognizing this mode, the control circuit CONT sets the data representing the auto-verify mode to the latch circuit FF7 shown in FIG. 3, for example, so as to attain the auto-verify mode. In this embodiment, the data $\overline{Dout}$ is outputted to the data input/output terminal I/O so that setting of the operation mode to the auto-verify mode can be determined externally thereof. This data $\overline{Dout}$ is associated with the data of the memory cell outputted from the output buffer DOB when the chip enable signal $\overline{CE}$ is kept at the high level and the output enable signal $\overline{OE}$ is lowered from the high level to the low level, or in other words, the data Dour read out from the verify mode. Namely, when the data Dout read out by the verify mode is set to the auto-verify mode, its phase is inverted by the output buffer DOB and the data is again outputted as the data $\overline{Dout}$ from the output buffer DOB. This function can be attained by a logic circuit which inhibits the output of the signal from the sense amplifier SA to the data output buffer DOB when the above-mentioned signal AP is generated, makes the phase comparison of the sense amplifier SA output, latches it and then transfers it to the output buffer DOB, for example.

This embodiment eliminates the necessity for providing the command for designating the auto-verify mode from outside the EPROM and can prevent erroneous setting of the commands. In particular, when the setting of the command data is made, the high voltage $V_{pp}$ is applied to a predetermined external address terminal Apd as represented by one-dot-chain line in FIG. 7 and the data at the input/output terminal I/O at this time may be set as the command data to the command latch circuits FF0–FF6. For this purpose, a detection circuit is connected to the address terminal Apd as shown in FIG. 6 which also commonly corresponds to the external terminal corresponding to $\overline{CE}$ (Ai), and the signal $\overline{HAi}$ shown in FIG. 6 and its phase inversion signal HAi are used as the signals $\overline{ACD}$, ACD shown in FIG. 3. However, the command latch circuit FF7 may be prevented from receiving the data from the input/output terminal I/O in this case.

The following results and advantages realized therefrom are obtainable from this embodiment:

(1) The write time for the memory array consisting of nonvolatile memory devices whose threshold voltages are changed in accordance with electrical write information being inputted and which are disposed in a matrix arrangement, including rows and columns of such non-volatile memory devices, is set in accordance with the time signal generated in the internal circuit and the operation mode thereof is automatically switched to the verify mode after the end of the write operation. Since the memory itself can thus manage the write time in the internal circuit and the operating mode is automatically switched to the verify mode after the end of the write operation, there can be obtained the effect that the write operation control with the write confirmation can be easily facilitated.

(2) As a result of that described in the item (1) there can also be effected a write operation in connection with a system wherein it includes microprocessor or the like and the EPROM.

(3) Since the invention employs the structure where data comparison is effected inside the system in the verify mode and the coincidence/non-coincidence signal is outputted, the write operation by so-called "high speed algorithm" can be made and degradation of device characteristics due to excessive writing can be prevented.

(4) Due to the effect (3), data comparison in the microprocessor or the like in the verify mode can be eliminated. Accordingly, the microprocessor can be allotted to other data processing until the write operation is completely finished and through-put of the system can thus be improved.

Although the present invention has thus been described specifically with reference to some embodiments thereof, the invention is not particularly limited thereto but can of course be changed or modified in various manners without departing from the spirit and scope thereof. For example, it is possible to employ the structure for EPROM where the read signal is outputted externally of the EPROM in the verify mode. In this case, coincidence/non-coincidence determination with the write data is made by an external microprocessor or a writer. In this structure, too, setting of the write time having at least a relatively long time is made inside the system and the write operation by the microprocessor or the like becomes simple.

Besides the use of the high voltage of the chip enable signal $\overline{CE}$ as previously described, setting of the auto-verify mode can take various forms such as through the utilization of the high voltage of the output enable signal $\overline{OE}$ or of the address terminal, the utilization of the signal timing such as that of the chip enable signal $\overline{CE}$ and the output enable signal $\overline{OE}$, such as, with respect to the determination of the high or low level of the signal $\overline{CE}$ in accordance with the change of output enable signal $\overline{OE}$ to the low level, or through the addition of control terminals, and so forth. If the ternary input function and the signal timing are utilized as previously described, increase in the number of control terminals as a result of an addition or diversification of the operation modes can be prevented. The page program mode which can be used for writing bulk information data may or may not be omitted.

Relief of defective word lines or data lines may be made by disposing redundant word lines or data lines for the word lines and/or data lines of the memory array MARY.

The structure for generating the various signals described above is not limited to the structure of the foregoing embodiments but that various modification thereof including other embodiments may be employed.

In the embodiments shown in FIGS. 1 and 7, predetermined data may be disposed in advance as the command data CD in the EPROM and external data may be supplied externally therefrom only when the command data need be changed.

This invention can be applied similarly to various electrically erasable programmable read only memories (EEPROMs) besides that of an electrically writable EPROM. These semiconductor memory devices may be disposed inside a semiconductor integrated circuit such as a 1-chip microcomputer.

The effects realized by the various aspects and improvements typifying the invention disclosed herein are briefly described as follows. The write time for the memory array consisting of nonvolatile memory devices whose threshold voltages are changed in accordance with electrical write information and which are disposed in a matrix arrangement, as that previously described, is set in accordance with the time signals generated by the internal circuit and the operation mode is automatically switched to the verify mode after the end of the write operation. Since the memory itself thus manages the write time by the internal circuit and the operation mode is automatically switched to the verify mode after the end of the write operation, control of the write operation involving the write confirmation thereby becomes simplified.

What is claimed is:

1. A semiconductor memory device, formed on a semiconductor chip, comprising:

a plurality of memory arrays, each including a plurality of electrically programmable read only memory cells and data lines;

a plurality of external address terminals which receive address signals indicative of ones of the memory cells to be selected in said plurality of memory arrays;

a plurality of external data terminals which at least receive data to be electrically programmed in memory cells selected in accordance with said address signals;

at least one control terminal which is provided with an external control signal;

register means for storing command data from said plurality of external data terminals;

control means for providing control signals for performing programming operations and verify operations for the selected memory cells, in response to command data stored in said register means;

data latch means, coupled to said data lines, for latching program data and for providing the program data to said data lines included in at least one of said plurality of memory arrays in accordance with the control signals;

data output means for reading out data from the selected memory cells to the plurality of external data terminals after performing the programming operations for the selected memory cells; and comparing means, coupled to said data latch means and to said data output means, for comparing the program data from said data latch means with data in the selected memory cells in the verify operations, and providing a signal outcome indicative of a comparing result, wherein said data output means outputs state signals, responsive to the signal outcome, to at least two terminals of the plurality of external data terminals, in response to a change of the external control signal.

2. The semiconductor memory device according to claim 1, wherein time in the programming operations and the verify operations is set by a command data supplied from said plurality of external data terminals.

3. The semiconductor memory device according to claim 2, wherein one of the state signals indicates that the programming operation of said memory device is a success, and another indicates completion of the programming operations and the verify operations by exceeding the time set by said command data.

4. The semiconductor memory device according to claim 2, wherein one of the state signals indicates the programming operations and the verify operations are performing in the time set by said command data.

5. The semiconductor memory device according to claim 2, wherein one of the state signals indicates that the programming operation of said memory device is a failure, and another indicates completion of the programming operations and the verify operations by exceeding the time set by said command data.

6. The semiconductor memory device according to claim 3, further comprising address latch means for latching the address signals from said plurality of external address signals.

7. The semiconductor memory device according to claim 4, further comprising address latch means for latching the address signals from said plurality of external address signals.

8. The semiconductor memory device according to claim 5, further comprising address latch means for latching the address signals from said plurality of external address signals.

9. The semiconductor memory device according to claim 6, wherein said control means has information for limiting the time that the programming operations and the verify operations are performed.

10. The semiconductor memory device according to claim 7, wherein said control means has information for limiting the time that the programming operations and the verify operations are performed.

11. The semiconductor memory device according to claim 8, wherein said control means has information for limiting the time that the programming operations and the verify operations are performed.

12. The semiconductor memory device according to claim 9, wherein said control means receives the signal outcome from said comparing means, and further provides the control signals for performing the programming operations and the verify operations to the selected memory cells, if the signal outcome indicates that the read out data does not coincide with the program data in the time set by said command data.

13. The semiconductor memory device according to claim 10, wherein said control means receives the signal outcome from said comparing means, and further provides the control signals for performing the programming operations and the verify operations to the selected memory cells, if the signal outcome indicates that the read out data does not coincide with the program data in the time set by said command data.

14. The semiconductor memory device according to claim 11, wherein said control means receives the signal outcome from said comparing means, and further provides the control signals for performing the programming operations and the verify operations to the selected memory cells, if the signal outcome indicates that the read out data does not coincide with the program data in the time set by said command data.

15. The semiconductor memory device according to claim 1, wherein the number of times of the programming operations and the verify operations is set by command data supplied from said plurality of external data terminals.

16. The semiconductor memory device according to claim 15, wherein one of the state signals indicates that the programming operation of said memory device is a success, and another indicates completion of the programming operations and the verify operations by exceeding the number of times set by said command data.

17. The semiconductor memory device according to claim 15, wherein one of the state signals indicates the programming operations and the verify operations are performing in the number of times according to that set by said command data.

18. The semiconductor memory device according to claim 15, wherein one of the state signals indicates that the programming operation of said memory device is a failure, and another indicates completion of the programming operations and the verify operations by exceeding the number of times set by said command data.

19. The semiconductor memory device according to claim 16, further comprising address latch means for latching the address signals from said plurality of external address signals.

20. The semiconductor memory device according to claim 17, further comprising address latch means for latching the address signals from said plurality of external address signals.

21. The semiconductor memory device according to claim 18, further comprising address latch means for latching the address signals from said plurality of external address signals.

22. The semiconductor memory device according to claim 19, wherein said control means has information for limiting the number of times that the programming operations and the verify operations are performed.

23. The semiconductor memory device according to claim 20, wherein said control means has information for limiting the number of times that the programming operations and the verify operations are performed.

24. The semiconductor memory device according to claim 21, wherein said control means has information for limiting the number of times that the programming operations and the verify operations are performed.

25. The semiconductor memory device according to claim 22, wherein said control means receives the signal outcome from said comparing means, and further provides the control signals for performing the programming operations and the verify operations to the selected memory cells, if the signal outcome indicates that the read out data does not coincide with the program data in the number of times set by said command data.

26. The semiconductor memory device according to claim 23, wherein said control means receives the signal outcome from said comparing means, and further provides the control signals for performing the programming operations and the verify operations to the selected memory cells, if the signal outcome indicates that the read out data does not coincide with the program data in the number of times set by said command data.

27. The semiconductor memory device according to claim 24, wherein said control means receives the signal outcome from said comparing means, and further provides the control signals for performing the programming operations and the verify operations to the selected memory cells, if the signal outcome indicates that the read out data does not coincide with the program data in the number of times set by said command data.

28. A semiconductor memory device, formed on a semiconductor chip, comprising:

a plurality of memory arrays, each including a plurality of electrically programmable read only memory cells and data lines;

a plurality of external address terminals which receive address signals indicative of ones of the memory cells to be selected in said plurality of memory arrays;

a plurality of external data terminals which at least receive data to be electrically programmed in memory cells selected in accordance with said address signals;

at least one control terminal which is provided with an external control signal;

a register which stores command data from said plurality of external data terminals;

a control unit which provides control signals for performing programming operations and verify operations for the selected memory cells, in response to command data stored in said register;

a data latch, coupled to said data lines, which latches program data and which provides the program data to said data lines included in at least one of said plurality of memory arrays in accordance with the control signals;

a data output unit which reads out data from the selected memory cells to the plurality of external data terminals after performing the programming operations for the selected memory cells; and a comparing unit, coupled to said data latch and to said data output unit, which compares the program data from said data latch with data in the selected memory cells in the verify operations, and which provides a signal outcome indicative of a comparing result, wherein said data output unit outputs state signals, responsive to the signal outcome, to at least two terminals of the plurality of external data terminals, in response to a change of the external control signal.

29. The semiconductor memory device according to claim 28, wherein time in the programming operations and the verify operations is set by a command data supplied from said plurality of external data terminals.

30. The semiconductor memory device according to claim 29, wherein one of the state signals indicates that the programming operation of said memory device is a success, and another indicates completion of the programming operations and the verify operations by exceeding the time set by said command data.

31. The semiconductor memory device according to claim 29, wherein one of the state signals indicates the programming operations and the verify operations are performing in the time set by said command data.

32. The semiconductor memory device according to claim 29, wherein one of the state signals indicates that the programming operation of said memory device is a failure, and another indicates completion of the programming operations and the verify operations by exceeding the time set by said command data.

33. The semiconductor memory device according to claim 30, further comprising an address latch which latches the address signals from said plurality of external address signals.

34. The semiconductor memory device according to claim 31, further comprising an address latch which latches the address signals from said plurality of external address signals.

35. The semiconductor memory device according to claim 32, further comprising an address latch which latches the address signals from said plurality of external address signals.

36. The semiconductor memory device according to claim 33, wherein said control unit has information for limiting the time that the programming operations and the verify operations are performed.

37. The semiconductor memory device according to claim 34, wherein said control unit has information for limiting the time that the programming operations and the verify operations are performed.

38. The semiconductor memory device according to claim 35, wherein said control unit has information for limiting the time that the programming operations and the verify operations are performed.

39. The semiconductor memory device according to claim 36, wherein said control unit receives the signal outcome from said comparing unit, and further provides the control signals for performing the programming operations and the verify operations to the selected memory cells, if the signal outcome indicates that the read out data does not coincide with the program data in the time set by said command data.

40. The semiconductor memory device according to claim 37, wherein said control unit receives the signal outcome from said comparing unit, and further provides the control signals for performing the programming operations and the verify operations to the selected memory cells, if the signal outcome indicates that the read out data does not coincide with the program data in the time set by said command data.

41. The semiconductor memory device according to claim 38, wherein said control unit receives the signal outcome from said comparing unit, and further provides the control signals for performing the programming operations and the verify operations to the selected memory cells, if the signal outcome indicates that the read out data does not coincide with the program data in the time set by said command data.

42. The semiconductor memory device according to claim 28, wherein the number of times of the programming operations and the verify operations is set by command data supplied from said plurality of external data terminals.

43. The semiconductor memory device according to claim 42, wherein one of the state signals indicates that the programming operation of said memory device is a success, and another indicates completion of the programming operations and the verify operations by exceeding the number of times set by said command data.

44. The semiconductor memory device according to claim 42, wherein one of the state signals indicates the programming operations and the verify operations are performing in the number of times according to that set by said command data.

45. The semiconductor memory device according to claim 42, wherein one of the state signals indicates that the programming operation of said memory device is a failure, and another indicates completion of the programming operations and the verify operations by exceeding the number of times set by said command data.

46. The semiconductor memory device according to claim 43, further comprising an address latch which latches the address signals from said plurality of external address signals.

47. The semiconductor memory device according to claim 44, further comprising an address latch which latches the address signals from said plurality of external address signals.

48. The semiconductor memory device according to claim 45, further comprising an address latch which latches the address signals from said plurality of external address signals.

49. The semiconductor memory device according to claim 46, wherein said control unit has information for limiting the number of times that the programming operations and the verify operations are performed.

50. The semiconductor memory device according to claim 47, wherein said control unit has information for limiting the number of times that the programming operations and the verify operations are performed.

51. The semiconductor memory device according to claim 48, wherein said control unit has information for limiting the number of times that the programming operations and the verify operations are performed.

52. The semiconductor memory device according to claim 49, wherein said control unit receives the signal outcome from said comparing unit, and further provides the control signals for performing the programming operations and the verify operations to the selected memory cells, if the signal outcome indicates that the read out data does not coincide with the program data in the number of times set by said command data.

53. The semiconductor memory device according to claim 50, wherein said control unit receives the signal outcome from said comparing unit, and further provides the control signals for performing the programming operations and the verify operations to the selected memory cells, if the signal outcome indicates that the read out data does not coincide with the program data in the number of times set by said command data.

54. The semiconductor memory device according to claim 51, wherein said control unit receives the signal outcome from said comparing unit, and further provides the control signals for performing the programming operations and the verify operations to the selected memory cells, if the signal outcome indicates that the read out data does not coincide with the program data in the number of times set by said command data.

55. A semiconductor memory device, formed on a semiconductor chip, comprising:

a plurality of memory arrays, each including a plurality of electrically programmable read only memory cells and data lines;

a plurality of external address terminals which receive address signals indicative of ones of the memory cells to be selected in said plurality of memory arrays;

a plurality of external data terminals which at least receive data to be electrically programmed in memory cells selected in accordance with said address signals;

at least one control terminal which is supplied with an output enable signal for enabling outputting of data stored in memory cells selected by address signals;

a register storing command data from said plurality of external data terminals:

a control circuit providing control signals for performing programming operations and verify operations for the selected memory cells, in response to command data stored in said register;

a data latch, coupled to said data lines, latching program data and providing the program data to said data lines included in at least one of said plurality of memory arrays in accordance with the control signals;

a data output circuit reading out data from the selected memory cells to the plurality of external data terminals after performing the programming operations for the selected memory cells; and a comparing circuit, coupled to said data latch and to said data output circuit, comparing the program data from said data latch with data in the selected memory cells in the verify operations, and providing a signal outcome indicative of a comparing result, wherein said data output circuit outputs state signals, responsive to the signal outcome, to at least two terminals of the plurality of external data terminals, in response to a change of the output enable signal.

56. The semiconductor memory device according to claim 55, wherein time in the programming operations and the verify operations is set by a command data supplied from said plurality of external data terminals.

57. The semiconductor memory device according to claim 56, wherein one of the state signals indicates that the programming operation of said memory device is a success, and another indicates completion of the programming operations and the verify operations by exceeding the time set by said command data.

58. The semiconductor memory device according to claim 56, wherein one of the state signals indicates the programming operations and the verify operations are performing in the time set by said command data.

59. The semiconductor memory device according to claim 56, wherein one of the state signals indicates that the programming operation of said memory device is a failure, and another indicates completion of the programming operations and the verify operations by exceeding the time set by said command data.

60. The semiconductor memory device according to claim 57, further comprising an address latch latching the address signals from said plurality of external address signals.

61. The semiconductor memory device according to claim 58, further comprising an address latch latching the address signals from said plurality of external address signals.

62. The semiconductor memory device according to claim 59, further comprising an address latch latching the address signals from said plurality of external address signals.

63. The semiconductor memory device according to claim 60, wherein said control circuit has information for limiting the time that the programming operations and the verify operations are performed.

64. The semiconductor memory device according to claim 61, wherein said control circuit has information for limiting the time that the programming operations and the verify operations are performed.

65. The semiconductor memory device according to claim 62, wherein said control circuit has information for limiting the time that the programming operations and the verify operations are performed.

66. The semiconductor memory device according to claim 63, wherein said control circuit receives the signal outcome from said comparing circuit, and further provides the control signals for performing the programming operations and the verify operations to the selected memory cells, if the signal outcome indicates that the read out data does not coincide with the program data in the time set by said command data.

67. The semiconductor memory device according to claim 64, wherein said control circuit receives the signal outcome from said comparing circuit, and further provides the control signals for performing the programming operations and the verify operations to the selected memory cells, if the signal outcome indicates that the read out data does not coincide with the program data in the time set by said command data.

68. The semiconductor memory device according to claim 65, wherein said control circuit receives the signal outcome from said comparing circuit, and further provides the control signals for performing the programming operations and the verify operations to the selected memory cells, if the signal outcome indicates that the read out data does not coincide with the program data in the time set by said command data.

69. The semiconductor memory device according to claim 55, wherein the number of times of the programming operations and the verify operations is set by command data supplied from said plurality of external data terminals.

70. The semiconductor memory device according to claim 69, wherein one of the state signals indicates that the programming operation of said memory device is a success, and another indicates completion of the programming operations and the verify operations by exceeding the number of times set by said command data.

71. The semiconductor memory device according to claim 69, wherein one of the state signals indicates the programming operations and the verify operations are performing in the number of times according to that set by said command data.

72. The semiconductor memory device according to claim 69, wherein one of the state signals indicates that the programming operation of said memory device is a failure, and another indicates completion of the programming operations and the verify operations by exceeding the number of times set by said command data.

73. The semiconductor memory device according to claim 70, further comprising an address latch latching the address signals from said plurality of external address signals.

74. The semiconductor memory device according to claim 71, further comprising an address latch latching the address signals from said plurality of external address signals.

75. The semiconductor memory device according to claim 72, further comprising an address latch latching the address signals from said plurality of external address signals.

76. The semiconductor memory device according to claim 73, wherein said control circuit has information for limiting the number of times that the programming operations and the verify operations are performed.

77. The semiconductor memory device according to claim 74, wherein said control circuit has information for limiting the number of times that the programming operations and the verify operations are performed.

78. The semiconductor memory device according to claim 75, wherein said control circuit has information for limiting the number of times that the programming operations and the verify operations are performed.

79. The semiconductor memory device according to claim 76, wherein said control circuit receives the signal outcome from said comparing circuit, and further provides the control signals for performing the programming operations and the verify operations to the selected memory cells, if the signal outcome indicates that the read out data does not coincide with the program data in the number of times set by said command data.

80. The semiconductor memory device according to claim 77, wherein said control circuit receives the signal outcome from said comparing circuit, and further provides the control signals for performing the programming operations and the verify operations to the selected memory cells, if the signal outcome indicates that the read out data does not coincide with the program data in the number of times set by said command data.

81. The semiconductor memory device according to claim 78, wherein said control circuit receives the signal outcome from said comparing circuit, and further provides the control signals for performing the programming operations and the verify operations to the selected memory cells, if the signal outcome indicates that the read out data does not coincide with the program data in the number of times set by said command data.

* * * * *